United States Patent [19]

Nakayama et al.

[11] Patent Number: 4,800,105
[45] Date of Patent: Jan. 24, 1989

[54] METHOD OF FORMING A THIN FILM BY CHEMICAL VAPOR DEPOSITION

[75] Inventors: Izumi Nakayama, Hiratsuka; Akitoshi Suzuki, Chigasaki; Yoshiro Kusumoto, Chigasaki; Kazuo Takakuwa, Chigasaki; Tetsuya Ikuta, Chigasaki, all of Japan

[73] Assignee: Nihon Shinku Gijutsu Kabushiki Kaisha, Kanagawa, Japan

[21] Appl. No.: 74,579

[22] Filed: Jul. 17, 1987

[30] Foreign Application Priority Data

Jul. 22, 1986 [JP] Japan ............... 61-172313
Jul. 22, 1986 [JP] Japan ............... 61-172314

[51] Int. Cl.⁴ .................. C23C 16/08; C23C 16/30
[52] U.S. Cl. ........................ 427/253; 427/255; 427/255.1; 427/255.2; 427/255.5; 427/404; 427/419.7
[58] Field of Search ............... 427/255.2, 255, 255.5, 427/35, 38, 55, 255.1, 253, 419.1, 419.7, 404

[56] References Cited

U.S. PATENT DOCUMENTS

| | | | |
|---|---|---|---|
| 3,540,920 | 11/1970 | Wakefield | 427/255.2 |
| 4,180,596 | 12/1979 | Crowder et al. | 427/255.2 |
| 4,359,490 | 11/1982 | Lehrer | 427/255.2 |
| 4,391,846 | 7/1983 | Raymond | 427/255.2 |
| 4,504,521 | 3/1985 | Widmer et al. | 427/255.2 |
| 4,557,943 | 12/1985 | Rosler et al. | 427/255.2 |
| 4,565,157 | 1/1986 | Brors et al. | 427/255.2 |
| 4,568,565 | 2/1986 | Gupta et al. | 427/255.2 |
| 4,619,038 | 10/1986 | Pintchovski | 427/255.2 |
| 4,650,698 | 3/1987 | Moriya et al. | 427/255.2 |
| 4,668,530 | 5/1987 | Reif et al. | 427/255.2 |

OTHER PUBLICATIONS

White et al., "Preparation of Metal-Dielectric Mixtures for Microminiaturized Circuity", IBM Tech. Disclosure Bulletin, vol. 5, No. 3, Aug. 1962.

Primary Examiner—Sadie Childs
Attorney, Agent, or Firm—Larson and Taylor

[57] ABSTRACT

A method of a chemical vapor deposition wherein a first reactive gas containing a metal element and a second reactive gas containing metal element are fed into a reaction chamber in which at least one substrate is disposed under reduced pressure and said substrate is irradiated by a light beam, so that the growth rate of a thin film containing the metal element which to be formed on the surface of the substrate can be increased with the consumption of the reactive gas containing the metal element which is less than that of the conventional methods. The flows of the reactive gases can be maintained in a laminar flow state with good controllability in the entire area of the vicinity of the substrate.

8 Claims, 5 Drawing Sheets 4,800,105

METHOD OF FORMING A THIN FILM BY CHEMICAL VAPOR DEPOSITION

BACKGROUND OF THE INVENTION

This invention relates to a method of a chemical vapor deposition (CVD).

BACKGROUND OF THE INVENTION

It is well known that such chemical vapor deposition can be achieved by heating a substrate within a reaction chamber and bringing a reactive gas into contact with the heated substrate to produce a reaction therebetween.

U.S. Pat. No. 4,565,157 discloses a low pressure chemical vapor deposition system of tungsten silicides in which a cooled vacuum chamber contains a substrate turret assembly for holding and heating each sustrate during deposition, and the temperature of the chamber and the portions of the substrate turret assembly are maintained at temperatures low enough to substantially eliminate deposition on these parts, while at the same time each substrate is heated to cause deposition on the substrate surfaces. In the system disclosed in the above mentioned U.S. patent, the substrate turret assembly has substrate platens for holding the substrates, which are heated from the backside by lamps. The temperature at the outer surface of the platens is controlled by a microprocessor. The platens conduct heat from their back surface to their front surface where the substrates are located so that the temperature on the surface of each substrate is substantially almost the same as that on the outer surface of the respective platen, thereby causing a chemical reaction on the substrate surface and forming a film containing a metal thereon.

In the conventional CVD systems, it is necessary to supply a reactive gas containing a large quantity of a metal element to increase the growth rate since the growth rate of the thin film is proportional to the flow rate of the reactive gas containing the metal element and the proportional constant is small. However, such reactive gas generally has severe toxicity and corrosive property, and is expensive. It is, therefore, desirable to decrease the consumption of the reactive gas containing the metal element.

The conventional CVD systems have also disadvantages that a restriction in the thin film forming rate makes it difficult to process wafers or substrates one by one as the diameter of each wafer increases.

Further, in the conventional systems, the feed or stream of the gas is controlled only by two internal parameters such as pressure and reactive gas flow rate. Thus, it is impossible to externally control the gas flow so as to suppress the disturbance and the natural convection of the reactive gas which may be occurred in the reaction chamber. Therefore, there is a problem that thin films cannot be formed with excellent reproducibility, controllability and uniformity in wide pressure and flow rate ranges. Furthermore, the reaction components are diffused in the entire area in the reaction chamber. To avoid an adhesion of the diffused reaction components to the reaction chamber walls and an inspection window provided thereon, the reaction chamber walls or the housing are cooled by suitable cooling means. However, the generation of dusts, the mixture of impurities in the thin film to be formed due to the adhesion of the diffused reaction components to the reaction chamber walls and the inspection window cannot be avoided.

The laminarized jet of the reactive gases has merits as follows:

(a) It is possible to coincide the gas flow control with a simulation;

(b) The diffusion of the reaction gas and reaction product to reaction chamber walls can be suppressed by uniformly and locally feeding the reaction gas to the vicinity of the substrate.

It is, therefore, an object of this invention to overcome the disadvantages of the abovementioned conventional chemical vapor depositions and to provide a method of a chemical vapor deposition in which the growth rate of a thin film containing a metal element on a substrate is increased with the reduced consumption of a reactive gas containing a metal element.

Another object of the invention is to provide a method of a chemical vapor deposition in which a thin film can be formed with good reproducibility, controllability and uniformity.

SUMMARY OF THE INVENTION

According to one aspect of this invention, there is provided a method of forming a thin film on a substrate comprising the steps of feeding a first reactive gas containing a metal element and a second reactive gas containing no metal element into a reaction chamber in which at least one substrate is disposed under reduced pressure, and radiating a light beam from at least one heating lamp to said substrate in said reaction chamber to heat the substrate and produce chemical reaction on the surface of said substrate, thereby forming the thin film containing the metal element on the surface of said substrate.

According to a second aspect of this invention, there is provided a method of forming a thin film on a substrate comprising the steps of feeding a first reactive gas containing a metal element and a second reactive gas containing no metal element substantially parallel to the surface of at least one substrate disposed in a reaction chamber under reduced pressure in a sheet-like flow, feeding an inert gas or a gas containing the inert gas as a main component opposite to the surface of said substrate, and radiating a light beam from at least one heating lamp to said substrate in the reaction chamber to heat the substrate and thus produce chemical reaction on the surface of said substrate, thereby forming the thin film containing the metal element on the surface of said substrate.

Preferably, said first reactive gas may be any one or more selected from metallic halides such as $WF_6$, $MoF_6$, $TaF_5$, $CrF_4$, $TiF_4$, $TiCL_4$, $MoCl_5$, $WCl_6$, $ALCL_3$ and the like, and said second reactive gas may be any one or more selected from $SiH_4$, $H_2$, and $SiH_2CL_2$.

By radiating the light beam from the heating lamp to the surface of the substrate, the growth rate of the thin film containing the metal element which is to be formed on the surface of the substrate can be increased with the consumption of the gas containing the metal element which is less than that of the conventional methods.

Further, the flows of the first gas containing the metal element and the second gas containing no metal element can be maintained in a laminar flow state with good controllability in the entire area of the vicinity of the substrate, and a high uniformity can be obtained on the thin film formed on the substrate. The present method can prevent the reaction chamber walls and the inspection window from contaminating. Therefore, the system may be effectively simplified.

These and other objects, features, and advantags of this invention will become apparent from a study of the following description in which reference is directed to the accompaning drawings.

DETAILED DESCRIPTION OF THE INVENTION

Figure 1:
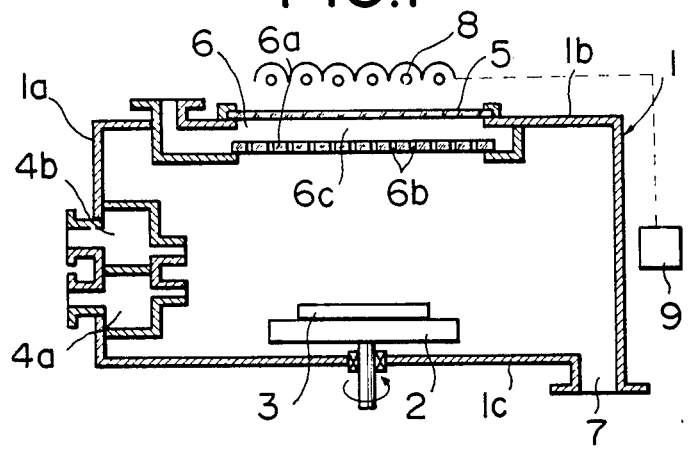
FIG. 1 is a schematic sectional view of an apparatus used for executing the method according to this invention.

Reference is now made to FIGS. 1 to 4 which schematically show an apparatus designed to carry out the improved chemical vapor deposition procedure of this invention. In the illustrated apparatus, reference numeral 1 denotes the reaction chamber in which the pressure is reduced. In the reaction chamber 1, there is disposed a rotatable substrate holder 2 for supporting one or more substrates 3 on which the desired thin film is to be formed. The substrate holder 2 is intended to be rotated by a suitable driving motor (not shown) provided on the outside of the chamber 1 at a predetermined RPM. The reaction chamber 1 has a wall portion 1a provided with two gas inlets 4a and 4b, each of which has a slit-like opening. The gas inlets 4a and 4b are connected to separated reactive gas sources (not shown), respectively. One 4a of the gas inlets is intended to feed the reactive gas containing the metal element, $WF_6$, and inert gas, Ar, in a sheet-like state substantially parallel to the surface of each substrate 3 into the reaction chamber 1, while the other gas inlet 4b is intended to feed the reactive gas containing no metal element, $SiH_4$, and inert gas, Ar, in a sheet-like state substantially parallel to the surface of each substrate 3 into the reaction chamber 1. The $SiH_4$, $WF_6$ and Ar gases thus fed though the gas inlets into the reaction chamber 1 are intended to flow along the surface of the substrate 3 in the reaction chamber 1.

The reaction chamber 1 has an upper wall portion provided with a transparent window 5 which may be made of quartz glass and an inert gas inlet 6. The inert gas inlet 6 comprises a gas injection member 6a which is formed of a transparent quarts glass provided with a plurality of openings 6b.

This gas injection member 6a is disposed under the transparent window 5 so that an inert gas passage 6c is formed therebetween. The inert gas such as Ar may be downwardly from the gas injection member 6a into the reaction chamber 1. The flow of the Ar gas injected downward into the reaction chamber 1 is intended to cross substantially perpendicularly to the flows of the $SiH_4$, $WF_6$ and Ar gases fed through the gas inlets 4a and 4b so as to prevent the $SiH_4$, $WF_6$ and Ar gases from upwardly penetrating.

The reaction chamber 1 has a bottom wall portion 1c provided with an exhaust port 7 for evacuating the $SiH_4$, $WF_6$ and Ar gases from the reaction chamber 1. The port 7 is connected to a suitable vacuum pump system (not shown).

Disposed outside the reaction chamber 1 above the upper wall portion 1b thereof is heating lamps 8 from which the light beam is irradiated through the quartz glass window 5 and the gas injection member 6a to the surface of the substrate 3 on the substrate holder 2, thereby heating the substrate 3 at a predetermined temperature. The operation of each lamp 8 is controlled by a control device 9 so that the temperature at the specific position in the reaction chamber 1 may be maintained at a predetermined level.

For purposes of clarity of illustration, it will be understood that only those portions of the reactor system necessary to illustrate the inventive concepts disclosed herein have been shown in the drawings.

The operation of the illustrated apparatus will be described with reference to FIGS. 2 to 4.

The reactive gas $SiH_4$ and the inert gas Ar are injected in a 2-dimentional jet-like flow as shown by arrows R through the gas inlet or nozzle 4a into a space A defined on the substrate 3. The reactive gas $WF_6$ and the inert gas Ar are similarly injected in a 2-dimentional jet-like flow as shown by arrows R' through the gas inlet or nozzle 4b into the space A. On the other hand, through the inert gas inlet 6 the Ar gas is injected downward into the reaction chamber 1 as shown by arrow Q. The flow rates of the gases to be injected can be externally controlled and, for example, it may be controlled that the flow rate of the inert gas flow Q becomes three times that of the reactive gas flows R and R'.

Figure 2:
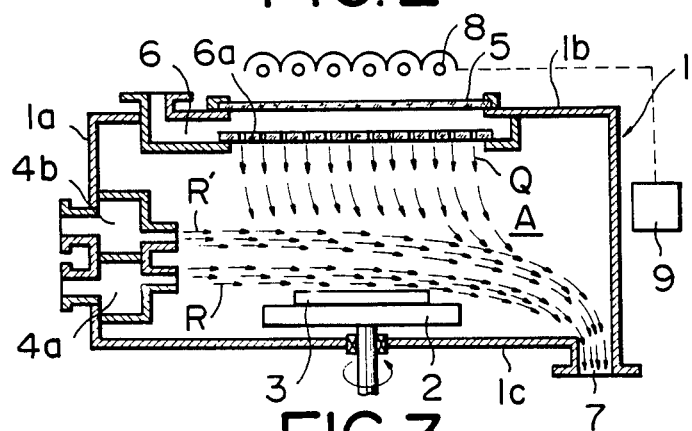
FIGS. 2, 3 and 4 are sectional views similar to that of FIG. 1 to illustrate the condition of different gas flows in the apparatus shown in FIG. 1, respectively.

As shown in FIG. 2, the gas flows R and R' are limited the vicinity of the substrate 3 on the substrate holder 2 and to be in laminar flow condition. It will be considered that this is because the downward flow Q of the inert gas from the inert gas inlet 6 restrains the gas flows R and R' of the reactive gases from the gas inlets 4a and 4b from above. This restraining action, that is the stabilizing action of the downward flow Q of the inert gas may be confirmed by a numerical simulation using a computer or by a visualization technique using titanium tetrachloride. When the gas flows R, R' and Q are observed in the entirety, as shown in FIG. 3, the gas flows R and R' (as hatched) become a localized laminar flow the range of which is determined by the inert gas flow Q. In other words, the shape, the extent or the range of the hatched portion can be controlled by adjusting the flow rate of the gas flow Q.

Figure 4:
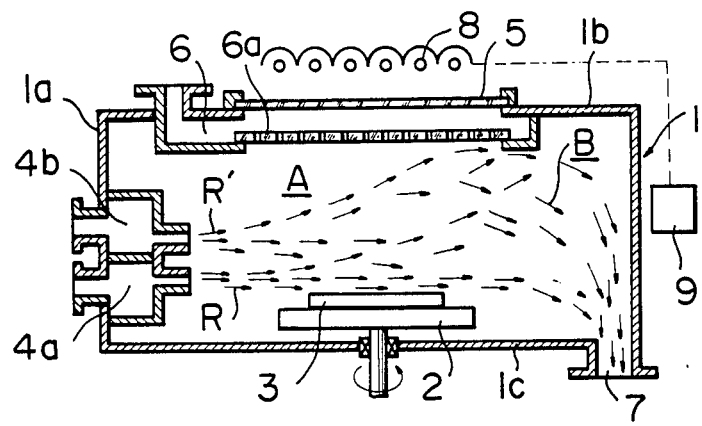

If no downward gas flow Q of the inert gas is given to the reactive gas flows R and R', as shown in FIG. 4, these gas flows R and R' are diffused so as to become turbulent flows in the area B of the space A. In this case, the walls of the reaction chamber 1, the transparent window through which the heating light beam is transmitted and the inspection window (not shown) provided on the chamber 1 are contaminated by the diffused reactive gas components, unless cooling means is provided, as in the conventional system.

Figure 3:
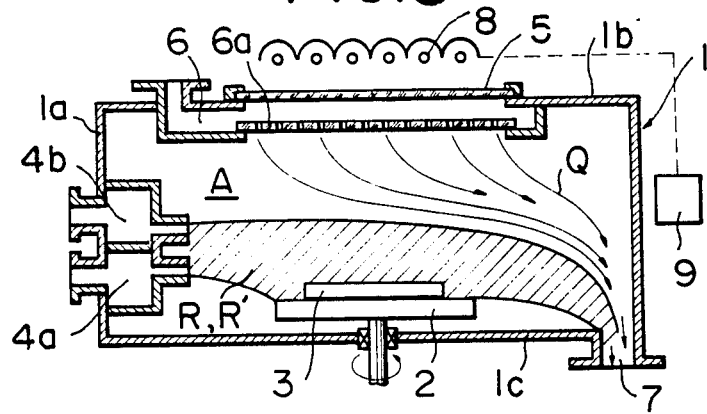

According to this invention, however, the reactive gas flows R and R' are positively stabilized as shown in FIG. 2 or 3, the reaction components are limited only to the vicinity of the substrate 3 on the substrate holder 2 to prevent the chamber walls and the transparent wall portion from contaminating. Therefore, the quality of the film formed on the substrate 3 can be improved, and the dust particles in the reaction chamber can be reduced.

Figure 5:
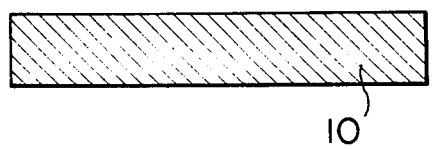
FIG. 5 is a sectional view showing a substrate which may be used in this invention.
Figure 6:
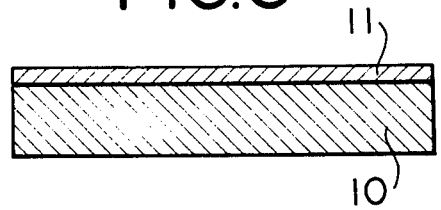
FIG. 6 is a sectional view showing the substrate of FIG. 5 on which a thin film containing a metal element, WSix.

In FIGS. 5 and 6, there is shown how the thin film containing the metal element, WSix, is formed on Si substrate 10 by using the apparatus illustrated in FIG. 1 in accordance with this invention.

By the control device 9, the heating lamps 8 can be controlled to maintain the specific area in the reaction chamber 1 at a predetermined temperature. By feeding the $WF_6$, $SiH_4$ and Ar gases into the reaction chamber 1 which is under reduced pressure through the gas inlets 4a, 4b and 6, respectively, and irradiating the light beam from the heating lamps 8 to the surface of the substrate 10 which is rotated in the reaction chamber 1 through the transparent window 5 and the transparent gas injection member 6a, a chemical reaction is occurred on the surface of the substrate 10 to grow WSix as time goes. Thus, the thin film 11 containing the metal element, WSix, is formed on the surface of the substrate 10 as shown in FIG. 6.

Figure 7:
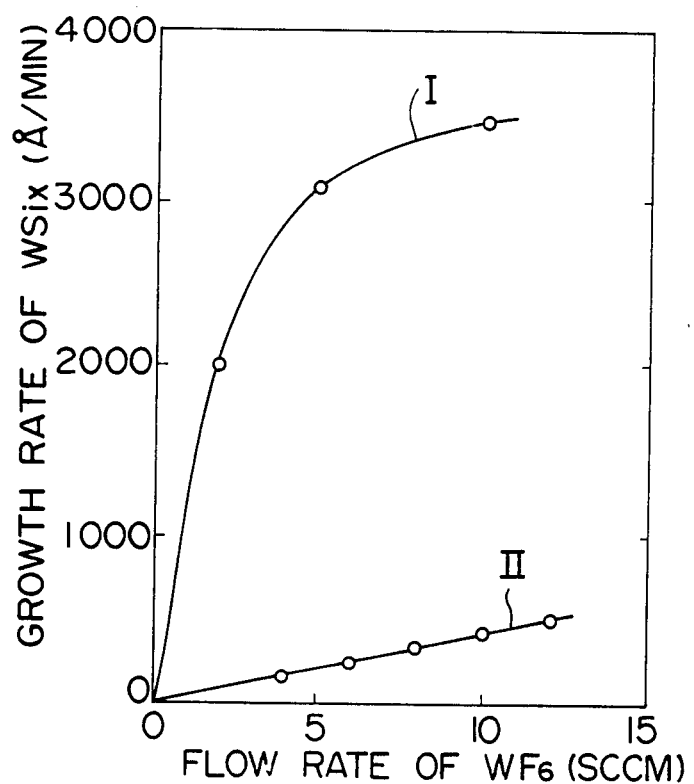
FIG. 7 is a graph showing the relation between a growth rate of WSix and a flow rate of $WF_6$ in the subject invention and the conventional method.

FIG. 7 is a graph for comparing the growth rate of the WSix by the method of this invention with that by the conventional method, wherein abscissa indicates the flow rate (SCCM) of $WF_6$ and ordinate indicates the growth rate (angstroms/min.) of WSix, the growth rate of WSix in this invention is indicated by a curve I, and a curve II shows the growth rate of WSix in the conventional method.

In the embodiment described above, the reactive gas containing the metal element has employed $WF_6$. However, it should be understood that the reactive gas containing the metal element may be any one or more selected from the metallic halides such as $MoF_6$, $TaF_5$, $CrF_4$, $TiF_4$, $TiCL_4$, $MoCl_5$, $WCl_6$, $ALCl_3$ and the like. The reactive gas containing no metal element has employed $SiH_4$. However, the reactive gas containing no metal element may be $H_2$, $SiH_2Cl_2$ or the like.

Further, in the illustrated embodiment, the reactive gases $WF_6$ and $SiH_4$ are respectively fed in the mixture of the Ar gas into the reaction chamber. However, these reactive gases may be fed without mixture of the Ar gas, respectively.

Figure 8:
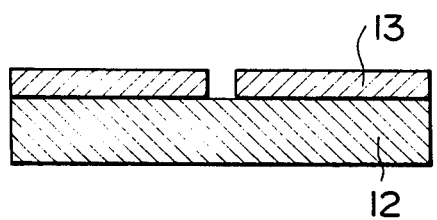
FIG. 8 is a sectional view of a Si substrate which has a surface portion on which a thin insulating film of $SiO_2$ is formed.

This invention is not intended to be limited to use the flat substrate made of Si. For example, $SiO_2$, $Al_2O_3$, glass, sapphire or the like may be used, and the substrate may be formed to have any structure. For example, as shown in FIG. 8, the substrate may comprise a flat plate 12 of Si on the surface of which an insulating thin film 13 of $SiO_2$ is provided.

Figure 9:
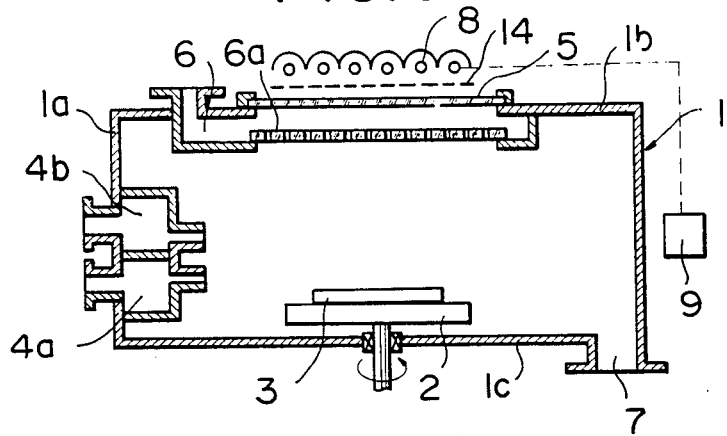
FIG. 9 is a schematic sectional view showing a modified apparatus used for executing the subject method.

In FIG. 9, there is shown a modification of the apparatus shown in FIG. 1, in which the arrangement is the same as that in the apparatus of FIG. 1 except that an optical filter 14 is provided between the heating lamps 8 and the transparent window 5 in the upper wall portion 1b of the reaction chamber, the light beam from the heating lamps 8 passing through the optical filter 14 to the substrate 3. The components corresponding to those in the apparatus of FIG. 1 are designated by the same or equivalent reference numerals.

Figure 10:
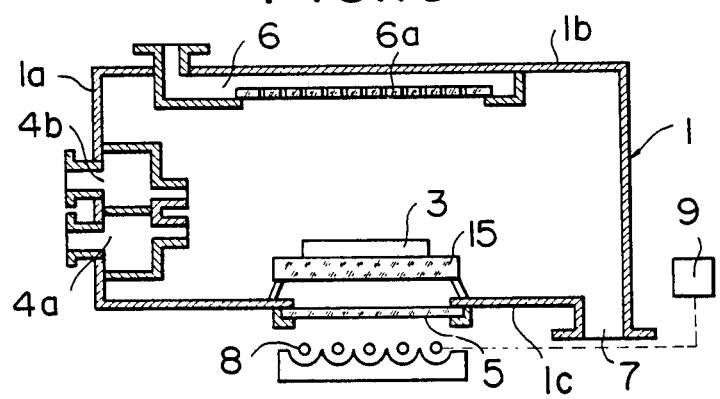
FIG. 10 is a schematic sectional view showing another modification of the apparatus.
Figure 11:
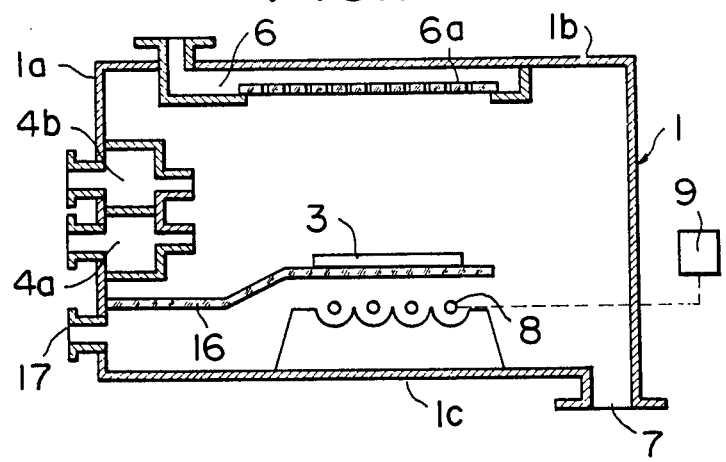
FIG. 11 is a schematic sectional view showing a further modification of the apparatus.

FIGS. 10 and 11 show another modifications of the apparatus of FIG. 1, in which the irradiation of the light beam is made on the back surface of the substrate 3. In FIGS. 10 and 11, substrate holders 15 and 16 are formed of a transparent material such as quartz. With the arrangement shown in FIG. 11, there is provided a second inert gas inlet 17 through which an inert gas is introduced into the space defined between the heating lamps 8 disposed in the reaction chamber 1 and the substrate holder 16 to prevent the reactive product from being aedhered to the heating lamps 8 and the transparent holder 16.

Figure 12:
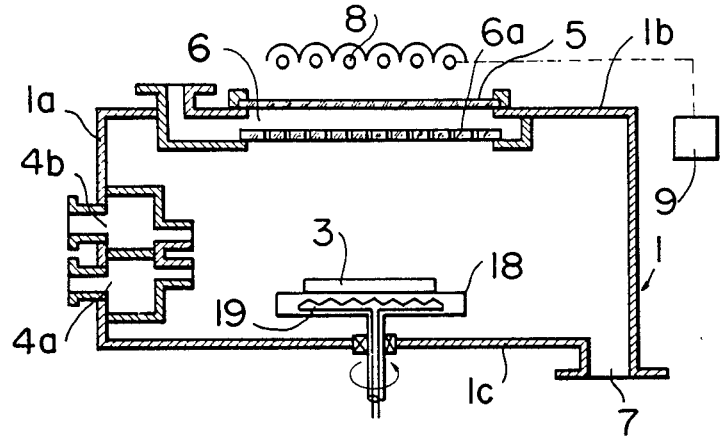
FIG. 12 is a schematic sectional view showing a further modification of the apparatus.

In a further modification of the apparatus shown in FIG. 12, a rotatable substrate holder 18 is provided with heating means 19. The components corresponding to those in the apparatus of FIG. 1 are designated by the same or equivalent reference numerals.

In the arrangements of FIGS. 1, 9 and 12, the substrate is rotated, but the substrate may not be rotated as shown in FIGS. 10 and 11.

Figure 13:
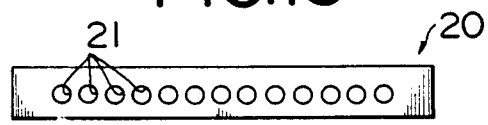
FIGS. 13 and 14 are schematic front views of different gas injecting nozzles which may be used in the apparatus, respectively.
Figure 14:
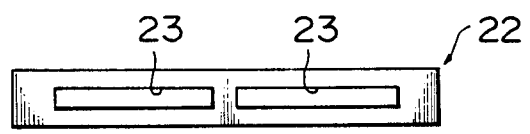

In FIGS. 13 and 14, there are shown different gas injecting nozzles which may be used for injecting the reactive gases into the reaction chamber. The nozzle shown in FIG. 13 comprises a flat hollow conduit 20 formed with a number of small openings 21 in the end wall thereof, the openings 21 being arranged in a line. The nozzle of FIG. 14 comprises a flat hollow conduit 22 the end wall of which two slits 23 are formed, these slits 23 being aligned laterally.

In the embodiments described above, the gas which is fed opposite to the surface of the substrate is the inert gas. However, a gas containing partly a reactive gas may be used. In this case, the contained reactive gas is necessarily of the type which does not produce dust particles. For example, $H_2$, $N_2$, $O_2$ or the like may be contained.

According to this invention, by using the light beam for heating the substrate, the growth rate of the thin film on the substrate can be effectively increased with decreasing of the consumption of the reactive gas containing the metal element as compared with the conventional method.

Further, this invention can prevent the reactive product from adhering to the reaction chamber walls and the transparent windows thereon without using cooling means, and thus the thin film of high quality can be obtained on the substrate.

What is claimed is:

1. An improved method of forming a thin film on a substrate by chemical vapor deposition comprising the steps of feeding a first reactive gas containing metal element and a second reactive gas containing no metal element, in a laminar flow condition substantially parallel to and limited to the surface of at least one substrate disposed in a reaction chamber under reduced pressure, feeding an inert gas or a gas containing the inert gas as a main component opposite to the surface of said substrate, so as to maintain the laminar flow condition of said first and second reactive gases and radiating a light beam from at least one heating lamp to said substrate in the reaction chamber to heat the substrate and thus produce chemical reaction on the surface of said substrate, thereby forming the thin film containing the metal element on the surface of said substrate.

2. A method according to claim 1, wherein said first reactive gas is any one or more selected from metallic halides such as $WF_6$, $MoF_6$, $TaF_5$, $CrF_4$, $TiF_6$, $TiCl_4$, $MoCl_5$, $WCl_6$ and $AlCl_6$.

3. A method according to claim 1, wherein said second reactive gas is any one or more selected from $SiH_4$, $H_2$, and $SiH_2Cl_2$.

4. A method according to claim 1, wherein said first reactive gas is injected with a mixture of an inert gas into the reaction chamber.

5. A method according to claim 1, wherein said second reactive gas is injected with a mixture of an inert gas into the reaction chamber.

6. A method according to claim 1, wherein said reaction chamber is supplied with an inert gas for preventing a reactive product from being adhered to the portions of said reaction chamber other than the substrate.

7. A method according to claim 1, wherein said substrate comprises a flat plate made of any one of Si, $SiO_2$, $Al_2O_3$, glass, or sapphire.

8. A method according to claim 1, wherein said substrate is provided with an insulating thin film on the surface thereof.

* * * * *